United States Patent
Bronson et al.

(10) Patent No.: US 6,621,353 B2
(45) Date of Patent: Sep. 16, 2003

(54) PHASE LOCKED LOOP RECONFIGURATION

(75) Inventors: Timothy Carl Bronson, Vestal, NY (US); David Andrew Thorndike, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/053,033

(22) Filed: Nov. 7, 2001

(65) Prior Publication Data

US 2003/0085768 A1 May 8, 2003

(51) Int. Cl.[7] .................................................. H03L 7/00
(52) U.S. Cl. ........................ 331/1 A; 327/156; 327/159; 713/500
(58) Field of Search ........................ 331/1 A, 16, 17, 331/25; 327/156–159; 332/127; 360/51; 375/328; 455/260; 713/500

(56) References Cited

U.S. PATENT DOCUMENTS 5,778,251 A * 7/1998 Kuroiwa et al. ............... 710/14
5,818,948 A    10/1998 Gulick
6,150,888 A    11/2000 Nakazawa
6,362,668 B1 *  3/2002 Lutley et al. ............... 327/113
6,545,549 B2 *  4/2003 Swoboda .................... 331/18

FOREIGN PATENT DOCUMENTS

| JP | 60107920 A | 6/1985 |
| JP | 61074485 A | 4/1986 |
| JP | 7030414 A | 1/1995 |
| JP | 11149704 A | 5/1999 |
| JP | 11149721 A | 6/1999 |

* cited by examiner

Primary Examiner—David C. Mis
(74) Attorney, Agent, or Firm—Whitham, Curtis & Christofferson, P.C.; William H. Steinberg

(57) ABSTRACT

Dedicated registers sequenced by a state machine capture phase locked loop reconfiguration values or parameters and load them into a reconfigurable phase locked loop in order to achieve rapid and reliable reconfiguration with high immunity from clock glitches and jitter as the phase locked loop goes in and out of lock. In the preferred environment of a digital bus, reconfiguration values or parameters can be supplied through a normal bus transaction and no dedicated connections are required for phase locked loop reconfiguration.

16 Claims, 2 Drawing Sheets

INPUTS:
x1 - Q_TIMER DONE
x2 - PW_TIMER DONE
x3 - CHG_PLL_CTL
x4 - RST#

OUTPUTS:
z1 - Q_TIMER START
z2 - PW_TIMER START
z3 - PLL_RESET
z4 - SELECT NEW CONFIGURATION
z5 - LOAD REG. MUX
z6 - CAPTURE REG. MUX

STATES:
S0 - INITIAL
S1 - CAPTURE
S2 - Q_TIMER WAIT
S3 - PLL RESET
S4 - LOAD/PW_TIMER WAIT
S5 - RUN

PHASE LOCKED LOOP RECONFIGURATION

BACKGROUND OF THE INVENTION

1. Field of the Invention

The present invention generally relates to phase locked loops and, more particularly, to reconfiguration of phase locked loops used for signal synchronization on integrated circuit chips.

2. Description of the Prior Art

Phase locked loops (PLLs) are a well-known type of circuit which are particularly useful for synchronization of signals when a signal frequency may change or drift and the frequency of a received signal must be closely tracked. Frequency modulated radio transmission receivers are a particularly well-known application for phase locked loops. Typically, a phase locked loop will contain a variable frequency (e.g. voltage controlled) oscillator as an internal clock; the output of which is compared with another signal and any phase discrepancy is fed back to the variable frequency oscillator as an error signal to adjust the frequency thereof. Thus, a local oscillator may be synchronized with an external clock or signal and allows the former to track frequency changes in the latter.

However, the frequency range over which tracking can be performed by a phase locked loop is often somewhat limited and the phase difference corresponding to an error signal of the magnitude necessary to drive a PLL oscillator to its variable frequency limits can be large. This phase difference can be quite significant and tolerable phase shifts may be limited in many applications, particularly digital communications. Therefore PLL designs must generally be designed for particular applications in consideration of the possible range of frequency variation, tracking accuracy in terms of resolution and response time) and allowable phase difference.

Relatively simple PLL circuits can be formed of relatively few elements if the operating parameters can be closely defined. However, to cover divergent frequency ranges, elements must often be substituted in PLL circuits or the PLL circuits otherwise reconfigured using switching elements that must be controlled with additional signals. Since PLLs operating over limited frequency ranges can be formed with relatively few circuit elements, they are often used for synchronization of digital signals in integrated circuits where signal propagation times may be quite variable but where frequency drift is generally limited.

For example, a data bus in an integrated circuit may comprise some of the longest signal paths in the chip design in order to traverse many of the operational portions or sections of the logic design which must be selectively connected during operation of the chip. Different operational sections of the integrated circuit will, of course be separated by different distances along the bus and different propagation times for signals between given sections of the integrated circuit will be evident. Synchronization is not particularly difficult in most cases for a bus connecting only portions of the same chip since only related clock frequencies derived from a single master oscillator for the chip are generally present. Therefore, a very simple PLL circuit is generally sufficient to lock a portion of the circuit to a signal it is to receive. Also, transmission over on-chip buses is predominantly in parallel and synchronization is principally for control of the data placed on the bus and the section of the chip which is to receive it.

The circumstance are quite different, however, for a bus used to interface with other chips or peripheral devices (e.g. input/output (I/O) buses) such as the peripheral component interconnect bus architecture (PCI) and the more recent version thereof referred to as PCI-X. In general, the signal paths are far longer and the number of signals which are propagated in parallel is often more limited: increasing the criticality of correct receipt of a sequence of changes of signal logic state over time. While transmission standards have been established, the bus architecture must usually accommodate several widely divergent frequencies or transmission bit rates in respective mode ranges. Therefore, complex and reconfigurable PLL circuits are necessary in such bus architectures.

Such a necessary capability, however, presents some practical difficulties for implementation. Devices for controlling bus architectures, such as PCI-X devices include registers to hold parameters of user defined configurations of the PLL. However, these registers must be clocked by the PLL in order to maintain synchronization with the PCI-X bus for storage of the PLL configuration parameters and glitches that result when a PLL is going in and out of a lock state cannot be tolerated even though these registers must be reset while the PLL is going through the reconfiguration process. Therefore, the normal configuration register such as are provided in a PCI/PCI-X device cannot be used as the exclusive means for holding reconfiguration data because these registers will be reset at the same time as the PLL when it is being reconfigured.

Use of an external source of the PLL configuration parameters is not practical for different configurations for each of even a small plurality of mode ranges since the number of configurations, if mapped to device package pins would increase the required size of the device package as well as increasing the complexity of making connections to the device. The only alternative at the present state of the art is to use an additional service processor to access the PLL through an IEEE 1149.1 interface, which may not be available and, in any case, would greatly increase the cost of implementation of the bus.

SUMMARY OF THE INVENTION

It is therefore an object of the present invention to provide a technique and inexpensive apparatus in a device for implementation of a bus architecture which allows reconfiguration of a PLL to accommodate a plurality of bus mode ranges through normal bus transactions.

It is another object of the invention to provide for control of a PLL over a plurality of operational mode ranges without requiring external direct control signal connections.

It is a further object of the invention to provide control of a PLL using circuitry which is controlled by the PLL.

In order to accomplish these and other objects of the invention, a combination of elements is provided including a clock source including a reconfigurable phase locked loop, a state machine providing a timed sequence of states, and at least one register for capturing reconfiguration parameters and loading the captured reconfiguration parameters into the reconfigurable phase locked loop responsive to the state machine.

In accordance with another aspect of the invention, a method for reconfiguring a phase locked loop is provided including steps of capturing reconfiguration parameters in a register means, and transferring the captured reconfiguration parameters to the phase locked loop, wherein the capturing step and the transferring step are performed in sequence responsive to a sequence of steps of a state machine and independently of clocking signals produced by the phase locked loop.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
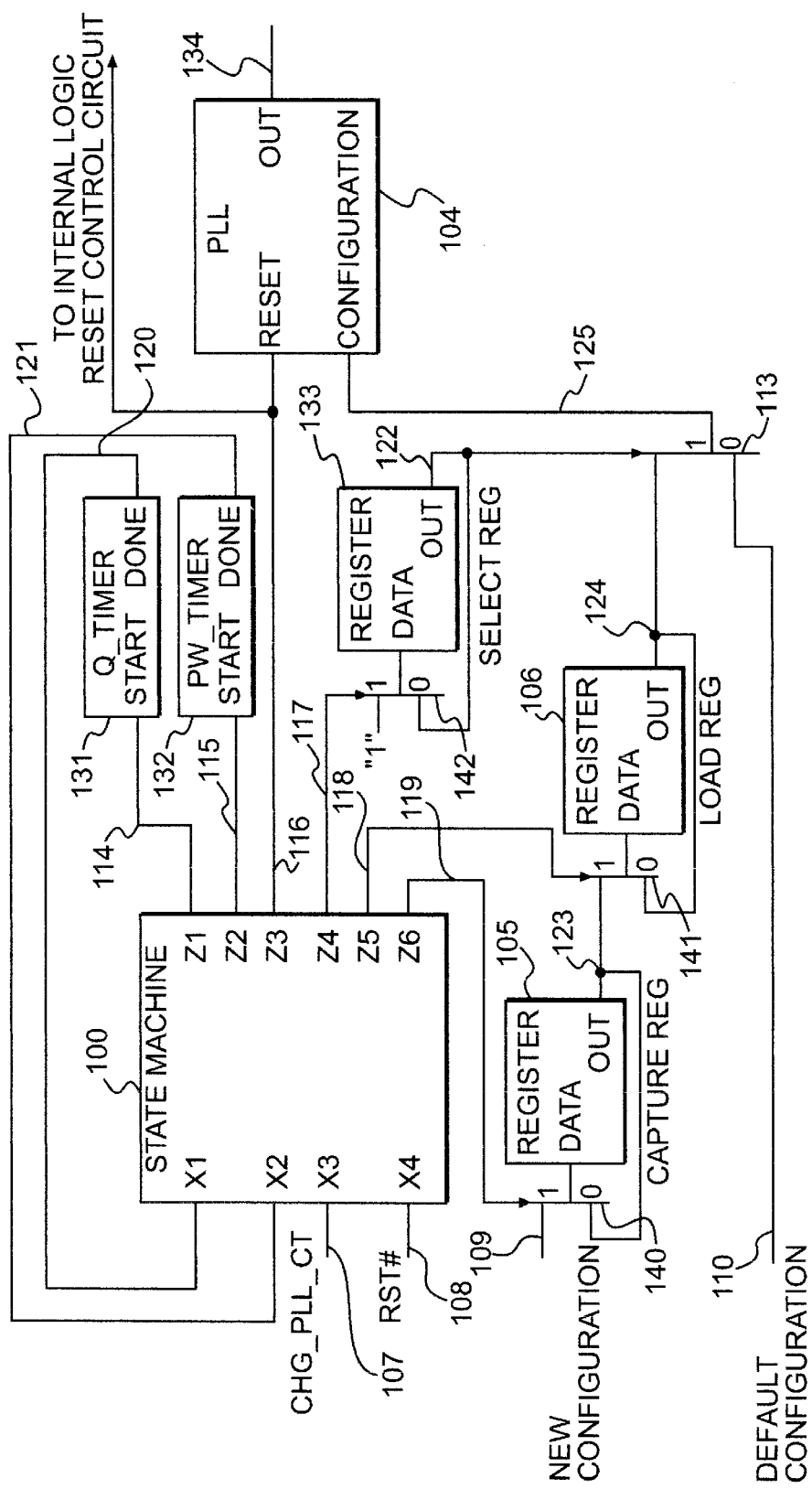
FIG. 1 is a block diagram of an exemplary embodiment of the invention.

Referring now to the drawings, and more particularly to FIG. 1, there is shown an exemplary preferred embodiment of the invention as applied to the preferred environment of a PCI/PCI-X bus architecture. It should be understood that the invention is applicable to the control of any phase locked loop (PLL) over a plurality of operational mode ranges without requiring external direct control signal connections such as may require dedicated pins of an integrated circuit package or other connections. That is, the invention allows control of a PLL by use of signals transmitted thereto by means of a circuit which is otherwise controlled by the PLL such as a data or interface bus. Thus, the invention provides a facility for capture of control signals communicated in synchronization with the PLL while the PLL is undergoing reconfiguration and going in and out of lock; causing glitches and clock jitter.

Figure 2:
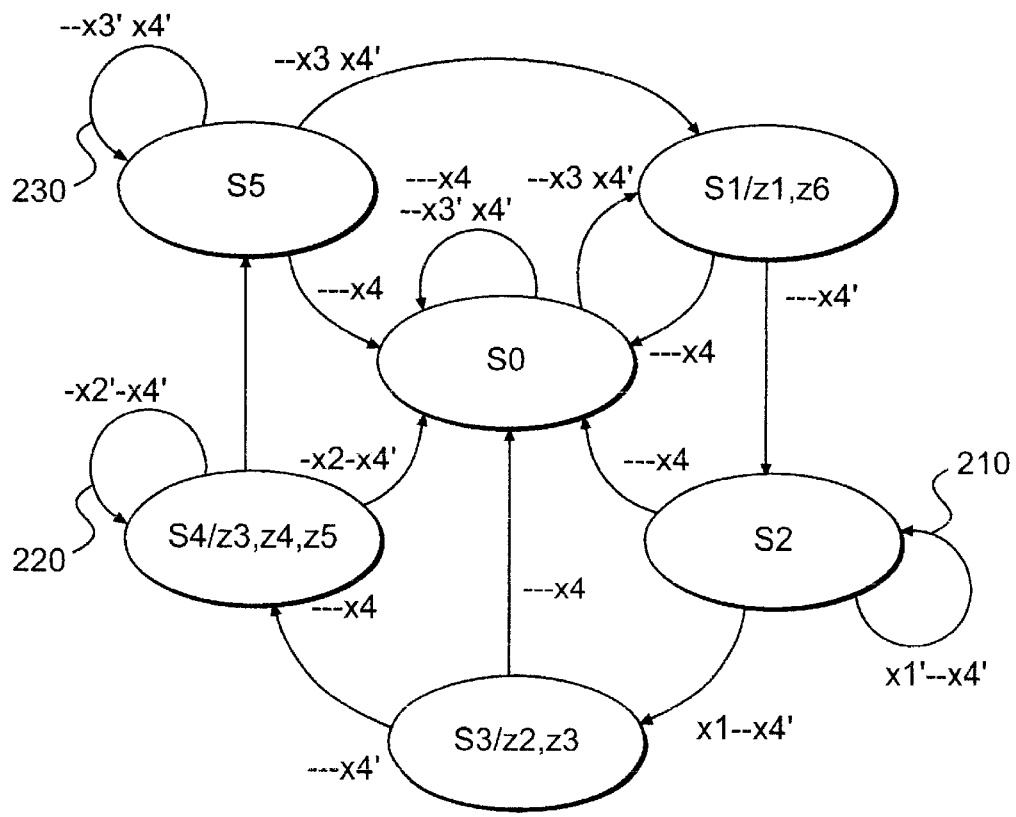
FIG. 2 is a state diagram illustrating preferred operation of a state machine in accordance with the embodiment of the invention illustrated in FIG. 1.

The invention accomplishes this function through the use of a state machine 100, functioning as illustrated in the state diagram of FIG. 2, to control the operation of two cascaded data registers 105 and 106, a multiplexer (mux) 113 and a reset control signal 116 for a PLL 104 in order to switch the configuration of the PLL 104 from a default configuration 110 to a new configuration 109 by progressing through a sequence of states as illustrated in FIG. 3; thus providing clocking of the configuration parameters through registers independently of the clocking provided by the PLL.

The reconfiguration process is triggered by the assertion of an input control signal (e.g. chg_pll_ctl) 107 which results in the capture of the new configuration values/parameters 109, preferably from the bus when the invention is utilized in a bus architecture, or any other existing data signal connection. Both the chg_pll_ctl signal and the new configuration values/parameters are generally and preferably outputs of implementation specific user defined configuration registers for which an accommodation is made in the functional environment such as a PCI/PCI-X bus architecture.

In order for the reconfiguration circuit of FIG. 1 to operate correctly,-the circuit must be isolated from the internal logic reset signal and internal clock signal; both of which are affected by the PLL reconfiguration process. Therefore, the reconfiguration circuit in accordance with the invention uses the PCI/PCI-X bus reset signal RST# (or its counterpart in other bus architectures or environments), rather than using the normal internal logic reset signal produced in a separate reset circuit that is affected by the signal line 116. The PCI/PCI-X bus reset signal RST# is used to clear all registers and return the state machine to its initial state s0, as would be done for a system reset, recovery after error detection or the like. The reconfiguration circuit in accordance with the invention also preferably uses the PCI/PCI-X bus clock rather than using the normal internal clock signal produced by the PLL on signal line 134. The default configuration input is a user-defined constant which is hardwired (or otherwise programmed in the device by the user or designer) for use by the PLL after a reset of the entire bus and all attached devices.

Thus the reconfiguration circuit of the preferred embodiment of the invention for the preferred PCI/PCI-X environment can be implemented quite simply by employing two standard signals and configuration registers which are available within the specifications of both PCI and PCI-X bus architectures. Comparable signals and configuration registers are generally required and therefore provided in most other environments where a reconfigurable PLL is needed. In most cases, compatibility with other environments can be achieved by adjusting the duration of delays implemented with the reconfiguration circuit.

State machine 100, in accordance with the preferred embodiment of the invention, thus has four inputs (x1–x4), six outputs (z1–z6), and six defined states (s0–s5), as illustrated in FIG. 2. Input x3 receives the signal chg_pll_ctl 107 and is used to initiate the sequence of states within the state machine 100 by forcing transition to the capture state s1 either from run state s5 or initial state s0. Input x4 receives the signal RST# 108 and is used to reset the the state machine 100 by forcing it to return to the initial state s0 regardless of the state it may be in at the time RST# is asserted on input x4. Inputs x1 and x2 receive respective signals from the outputs z1 and z2 of state machine 100; each deleyed by timers 131 and 132, respectively, and thus control the duration of the wait states s2 and s4 as indicated by arrows 210 and 220, respectively.

Once the state sequence is initiated by the assertion of chg_pll-ctl on input x3, the state machine 100 will step through the states s1–s4 which will drive the outputs z1–z6 in order to assert the reset of the PLL 104 and the internal logic while transferring the new configuration 109 through the two cascaded data registers 105 and 106 and trough the multiplexer 113, thereby providing the new configuration inputs to signal lines 125 which serve as the configuration inputs to PLL 104. Finally, the state machine 100 transitions to the run state s5 when the reset to the PLL is deasserted leading to the deassertion of the reset of the internal logic, completing the reconfiguration process.

More specifically and with reference to both FIGS. 1 and 2, the Chg_pll_ctl signal is fed to the x3 input of state machine 100 and the PCI reset signal RST# 108 is fed to the x4 input of state machine 100. The new configuration signal lines 109 are fed to capture register 105 through a multiplexer 140 at its input which also provides a feedback path of capture register output 123 to input multiplexer 140 for latching. Default configuration signal lines 110 are fed to multiplexer 113. The output 123 of capture register 105 is fed to an input multiplexer 141 of load register latch 106 having a similar feedback path. The output 124 of the load register 106 is also fed to the multiplexer 113; the output 125 of which is provided to PLL 104. The multiplexer is controlled by output 122 of select register 133 responsive to the z4 output of the state machine 100. Thus, a new configuration can be queued and multiplexed with the default configuration and can be used to control the PLL during reset of the internal registers thereof.

That is, the capture mux/register 105 provides a means of holding the new configuration values while the internal logic reset is asserted as part of the reconfiguration process. The new values are so held until they can be moved to the load mux/register 106 over line 123 and through mux 141. The load mux/register 106 provides a means to hold the new configuration values that serve as the input to the PLL 104 after the reconfiguration process is complete. The values in load mux/register 106 can only be updated when the PLL 104 is in the reset mode. The output of the load mux/register 106 are transferred to the PLL 104 through multiplexer 113.

As alluded to above, the state machine 100 provides control signals to timers 131 and 132, control signals to registers 133, 105, 106, a reset control signal 116 for the PLL 104 and the internal logic reset control circuit; preferably functioning as a Moore state machine that only transitions between states on rising edges of clock pulses (and which are preferably independent of the clock provided by the PLL). Under such control, the quiesce timer 131 provides a multi clock cycle delay between the PCI-X bus transaction used to initiate the reconfiguration process through input chg_pll_ctl 107 (x3) and the assertion of the reset control signal 116 through the z3 output of state machine 104. The delay produced by this timer may be determined by the designer of a particular implementation of the invention and is not critical to the successful practice of the invention. The delay is intended to allow time for internal logic to complete any current transactions (responsive to the clock source provided by the PLL) with external devices before the internal logic is reset. The output of the timer is returned to the x1 input of the state machine 100 to change the state to s3 which generates state machine outputs z2 and z3. Prior to input x1, state s2 persists as shown by loop 210 of FIG. 2.

Similarly, the pulse width timer 132 provides a multi clock cycle delay between the assertion and deassertion of the reset control signal 116. The output of the pulse width timer 132 is fed back to the x2 input of state machine 100 and causes the state to progress to run state s5. As before, load state s4 persists while x2 is inactive (x2') as shown by loop 220 in FIG. 2 during which state machine 100 outputs signals z3, z4 and z5. Similarly, run state persists while x3' and x4' are inactive as shown by loop 230. If x3 becomes active in state s5, indicating another reconfiguration is initiated, capture state s1 is assumed and a new reconfiguration sequence begins. That is, after a reconfiguration has taken place, the state machine will remain in state s5 during normal operation and will proceed directly to capture state s1 when a new reconfiguration sequence is initiated.

In response to z4 becoming active in state s4, the select register 133 provides the control signal used to determine whether the default configuration or the new configuration is fed to the configuration input of the PLL 104. The output of the select register 133 is fed on line 122 to the mux select input of the multiplexer 113, as well as to the 0 input of select mux 142 to perform a latching function when z4 is inactive. The PLL 104 is thus provided with reconfiguration parameters to provide the phase locking mechanism to align the rising edge of the PCI-X bus clock with the rising edge of the internal clock. The output of PLL 104 is fed on output line 134 to the clock used by the internal logic of the bus device. The multiplexer 113 is used to switch between the new and default configuration values for input to PLL 104.

In summary, the state machine 100 assumes the initial state (s0) from any current state when RST# is asserted. From the initial state (s0) or from the post-configuration run state (s5), the state machine assumes the capture state (s1) upon assertion of chg_pll_ctl, in which the new configuration is captured and then the state machine progresses through the remainder of states in sequence to quiesce the bus (s2), assert the PLL reset (s3), load the new configuration into the PLL while allowing time to meet the minimum PLL reset pulse width (s4) and then deassert the PLL reset and allow the PLL to begin operation under the new configuration (s5).

Thus it is seen that the invention provides an inexpensive and simple apparatus and technique for accomplishing PLL reconfiguration, particularly in combination with a bus architecture in which reconfiguration does not require dedicated pins or external connections and in which the PLL configuration can be communicated over the bus itself which is controlled by the PLL. Further, a high degree of immunity from clock glitches as the PLL goes in and out of lock and clock jitter is provided by the sequencing of registers using a state machine with feedback from timers.

While the invention has been described in terms of a single preferred embodiment, those skilled in the art will recognize that the invention can be practiced with modification within the spirit and scope of the appended claims.

We claim:

1. In combination,
    a clock source including a reconfigurable phase locked loop,
    a state machine providing a timed sequence of states, and
    register means for capturing reconfiguration parameters and load said reconfiguration parameters into said reconfigurable phase locked loop responsive to said state machine.

2. The combination as recited in claim 1, further including a digital communication bus wherein said reconfiguration parameters are captured from said digital communications bus.

3. The combination as recited in claim 1, wherein said state machine includes an input for receiving an output of said state machine through a first delay means to produce a first delay.

4. The combination as recited in claim 3, in which said first delay is sufficient for logic responsive to said clock source to complete a current transaction with external devices.

5. The combination as recited in claim 3, wherein said state machine includes an input for receiving an output of said state machine through a second delay means to produce a second delay.

6. The combination as recited in claim 5, in which said second delay is sufficient for reset of said reconfigurable phase locked loop.

7. The combination as recited in claim 6, in which said second delay begins subsequent to said first delay.

8. The combination as recited in claim 6, wherein said register means includes first and second registers respectively responsive to outputs of said state machine respectively controlled by said first and second delays.

9. The combination as recited in claim 1, further including a multiplexer for selecting between data captured by said register means and default configuration parameters.

10. The combination as recited in claim 8, further including a multiplexer for selecting between data captured by said register means and default configuration parameters.

11. A method for reconfiguring a phase locked loop including steps of
    capturing reconfiguration parameters in a register means, and
    transferring said reconfiguration parameters to said phase locked loop,
    said capturing step and said transferring step being performed in sequence responsive to a sequence of steps of a state machine.

12. The method as recited in claim 11, wherein said phase locked loop is included in a bus architecture and said reconfiguration parameters are captured from a bus of said bus architecture.

13. The method as recited in claim 12, wherein said bus architecture is a PCI/PCI-X bus architecture.

14. The method as recited in claim 11, wherein said state machine receives an input of a signal fed back from an output of said state machine through a delay means to produce said sequence of steps of said state machine.

15. The method as recited in claim 11, wherein a step of said sequence of steps of said state machine selects between said reconfiguration parameters captured in said capturing step and default parameters.

16. The method as recited in claim 11, wherein a step of said sequence of steps of said state machine selects between said reconfiguration parameters captured in said capturing step and default parameters.

\* \* \* \* \*